United States Patent [19]

Izumi et al.

[11] Patent Number: 6,043,108
[45] Date of Patent: Mar. 28, 2000

[54] LEAD FRAME WITH LEAD-SECURING TAPE BONDED TO THE INNER LEAD SECTIONS OF PLURAL LEADS AND A METHOD OF MANUFACTURING THE SAME

[75] Inventors: Atsuhiko Izumi; Syuji Izumi, both of Tokyo, Japan

[73] Assignee: NEC Corporation, Japan

[21] Appl. No.: 09/270,185

[22] Filed: Mar. 15, 1999

Related U.S. Application Data

[62] Division of application No. 08/591,310, Jan. 25, 1996, abandoned.

[30] Foreign Application Priority Data

Jan. 19, 1995 [JP] Japan ......................... 7-28920

[51] Int. Cl.⁷ ................... H01L 21/44; H01L 21/48; H01L 21/50; H01L 23/495
[52] U.S. Cl. ............................. 438/111; 257/695
[58] Field of Search .................... 438/106, 111; 257/666, 670, 676, 395

[56] References Cited

U.S. PATENT DOCUMENTS 5,637,913   6/1997   Kajihara .......................... 257/666

*Primary Examiner*—Charles Bowers
*Assistant Examiner*—Nema Berezny
*Attorney, Agent, or Firm*—Ostrolenk, Faber, Gerb & Soffen, LLP

[57] ABSTRACT

A lead frame comprises an island supported by island supports at its four corners and leads extending from its frame section to the island. The leads are composed of inner leads and outer leads which are connected to each other with dam bars. Plating layers are formed on the surfaces of the tip sections of the inner leads, and lead-fixing tape is bonded to the distal portions of the inner leads with an adhesive which acquires elastic properties when set. The lead-fixing tape is bonded with its inner side located 0.1 mm–2 mm inward from the tips of the inner leads.

2 Claims, 8 Drawing Sheets

LEAD FRAME WITH LEAD-SECURING TAPE BONDED TO THE INNER LEAD SECTIONS OF PLURAL LEADS AND A METHOD OF MANUFACTURING THE SAME

This is a divisional of application Ser. No. 08/591,310, filed Jan. 25, 1996, now abandoned.

BACKGROUND OF THE INVENTION

The present invention relates to a lead frame and a method of manufacturing the same, and more particularly to a lead frame with lead-fixing tape bonded to tip sections of the inner leads to prevent deformation of the leads and used in a resin sealed semiconductor device, and a method of manufacturing the same.

Semiconductor devices sealed by molding (hereunder referred to as molded semiconductor devices) are usually manufactured in the following manner. A semiconductor chip is die-bonded to an island of a lead frame, and a connection is established between pads on the semiconductor chip and inner leads of the lead frame with bonding wires such as fine aluminum wires. After the assembly has been sealed by transfer molding, the lead frame is trimmed, and the outer leads are formed.

X-ray inspection of molded semiconductor devices formed as mentioned above has revealed sweeping of the bonding wires which has caused or may cause shorts in adjacent bonding wires. This is believed to be a result of deformation of the inner leads or the bonding wires due to vibrations caused during transport or streaming of the resin in the molding process. Such defective modes are resulting with increasing frequency due to the recent tendency toward narrower pitches and longer wires necessary for increased lead counts.

SUMMARY OF THE INVENTION

Accordingly, it is an object of the present invention to provide a method of manufacturing an improved lead frame which is free from shorts in the adjacent bonding wires, and an improved lead frame.

The method of manufacturing a lead frame according to the present invention comprises the steps of:

preparing a lead frame base equipped with an island supported by island supports, a plurality of inner leads having tip sections located in the vicinity of the island and extending radially from the vicinity of the above-mentioned island, and an inner-lead-connecting section which connects the tip sections of the above-mentioned plurality of inner leads;

bonding lead-fixing tape to the above-mentioned plurality of inner leads to connect and fix them, with the inner side of the above-mentioned lead-fixing tape located 0.1 mm–2 mm outward from the tips of the above-mentioned plurality of inner leads; and removing the above-mentioned inner-lead-connecting sections from the above-mentioned lead frame base.

The lead frame according to the present invention comprising:

an island supported by island supports;

a plurality of inner leads having tip portions located in the vicinity of the island and extending radially from the vicinity of the above-mentioned island; and lead-fixing tape which is placed across and bonded to the above-mentioned plurality of inner leads to connect and fix the above-mentioned plurality of inner leads, with the inner side of the above-mentioned lead-fixing tape located 0.1 mm–2 mm outward from the tip portions of the above-mentioned plurality of inner leads.

Since the lead frame according to the present invention is manufactured with the lead-fixing tape bonded to the inner leads, the inner side of the tape being located 0.1 mm–2 mm outward from the tip portions of the inner leads, a cutting die may be used to cut off the inner-lead-connecting sections without contacting the lead-fixing tape which is therefore prevented from being peeled. In addition, in cases where the lead-fixing tape and the inner leads are fixed with an intervening adhesive having elastic properties, external forces which may result from vibrations caused during transport or molding of the lead frame and exerted thereon may be absorbed by elastic deformation of the adhesive itself, thus preventing cracking in the adhesive.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Before explaining the embodiments of the present invention, a prior art will first be explained in detail with reference to the drawings.

Figure 1A:
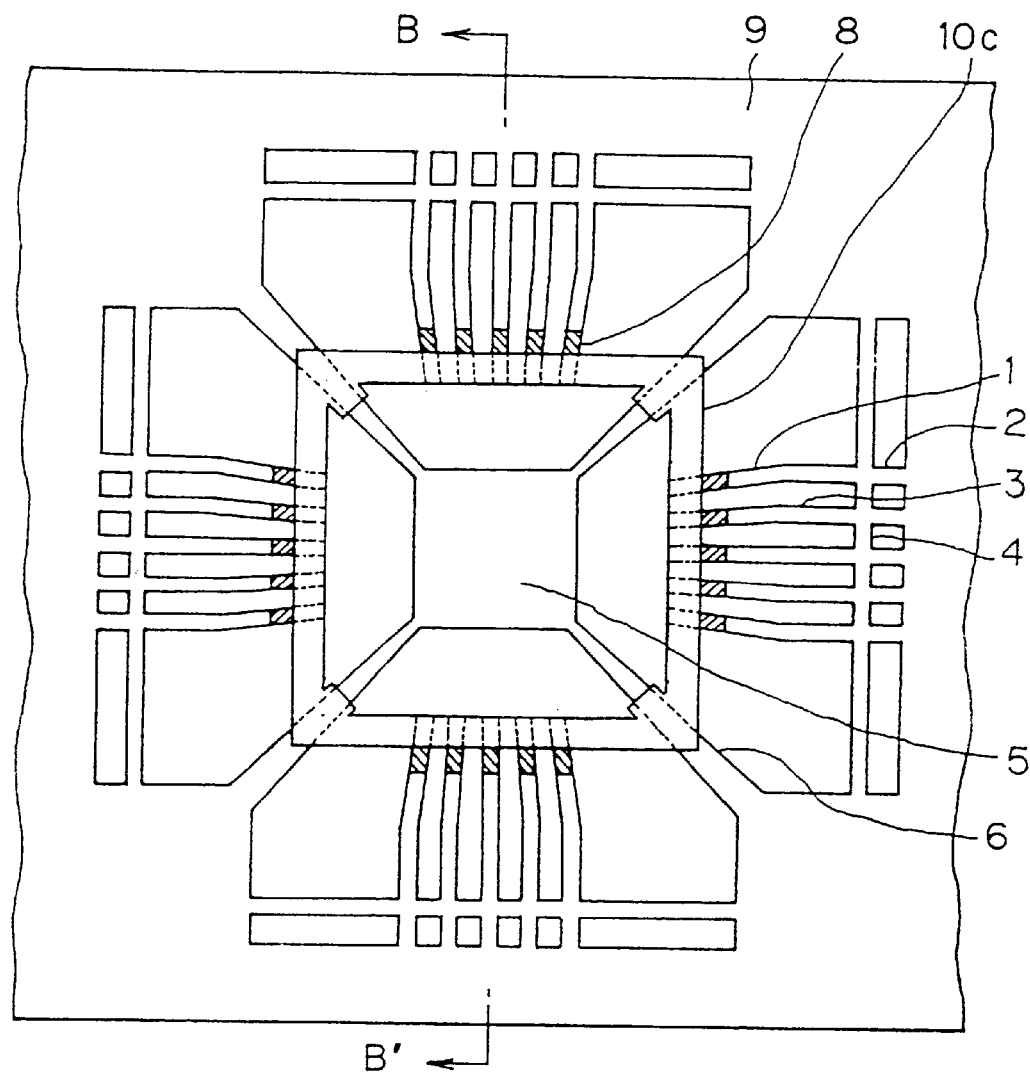
FIG. 1(a) is a plan view of a lead frame according to the prior art.
Figure 1B:
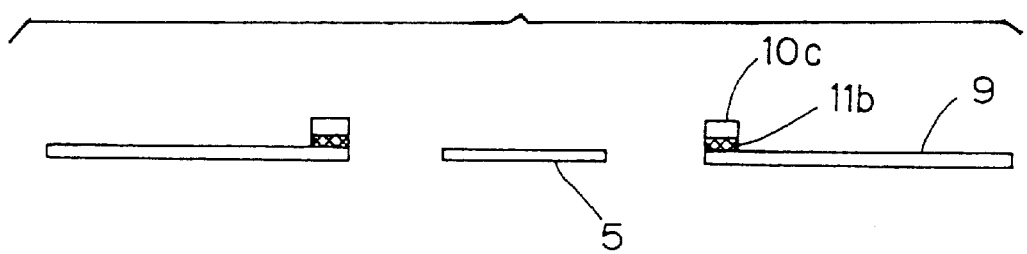
FIG. 1(b) is a cross-sectional view taken on the line B–B' in FIG. 1(a)

As shown in FIG. 1(a) and FIG. 1(b), a lead frame 9 formed of "alloy 42", a Cu material or the like comprises an island 5 supported by island supports 6 at its four corners and leads 3 extending from the frame section to the island 5. The leads 3 comprise inner leads 1 which are subjected to wire bonding and outer leads 2 which will lead out of the package, the inner leads 1 and the outer leads 2 being connected to each other with dam-bars 4.

The surface of each inner lead 1 has a plating layer 8 formed thereon, and lead-fixing tape 10c composed of a polyimide resin or the like is bonded to the distal sections of the inner leads 1 with an adhesive 11b composed of a thermosetting resin in order to overcome the drawbacks of the prior art mentioned above.

This type of lead frame of the prior art for molded semiconductor devices is manufactured in the following manner.

Figure 2:
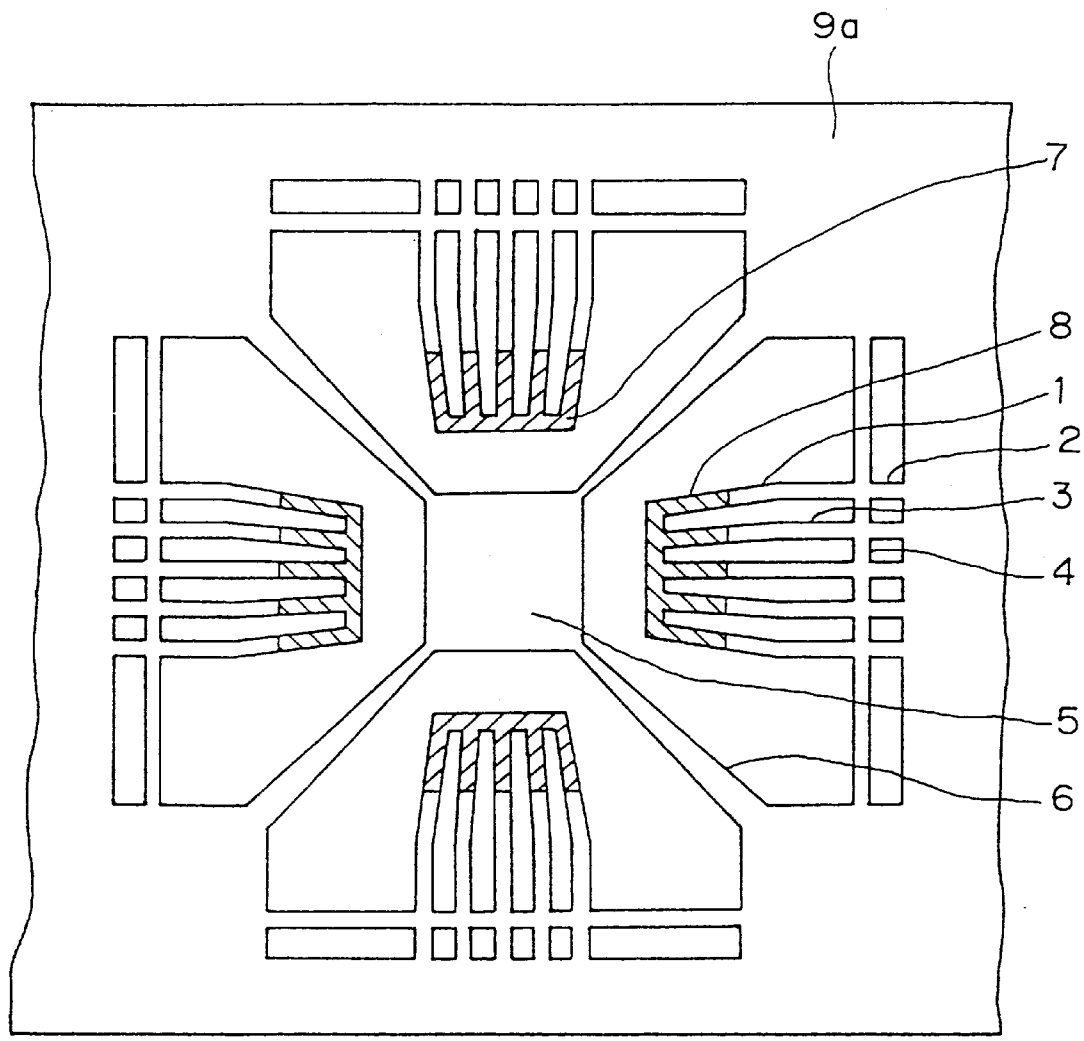
FIG. 2 is a plan view illustrative of a method of manufacturing the lead frame according to the prior art.

As shown in FIG. 2, a lead frame base 9a equipped with leads 3 connected with dam-bars 4 and an island 5 supported by island supports 6 is formed by etching or pressing a lead frame base material composed of "alloy 42", a Cu material or the like. Here, the leads 3 have inner leads 1 and outer leads 2. The tip sections of each of the inner leads 1 on each side are connected with an inner-lead-connecting section 7. Then, in order to increase reliability of wire bonding to the inner leads 1, plating layers 8 are formed on desired sites of the inner leads 1 by selective electroplating. Here, the plating is usually Ag plating deposited to a maximum thickness of 15 μm.

Figure 3:
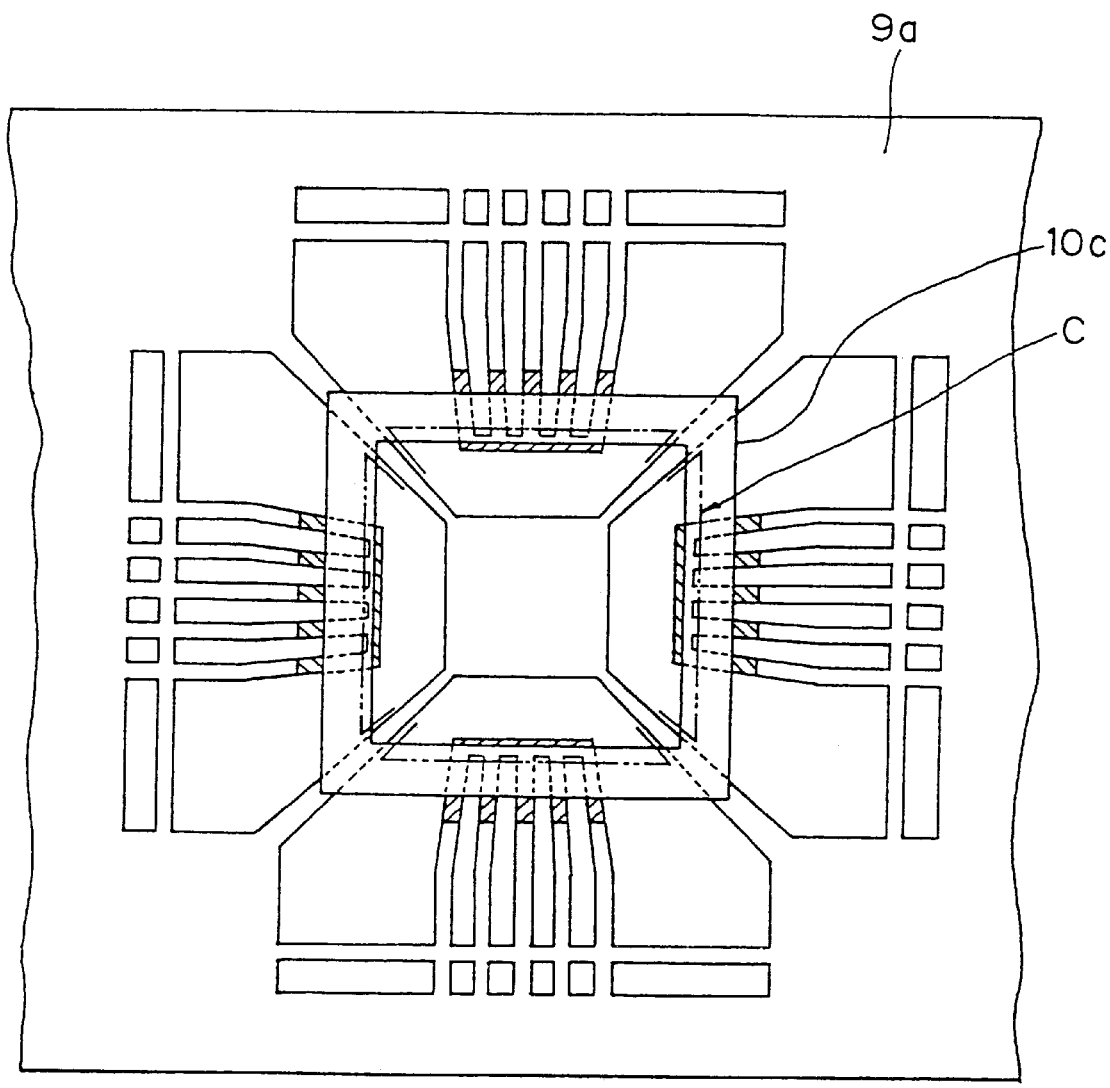
FIG. 3 is another plan view illustrative of the method of manufacturing the lead frame according to the prior art.

Subsequently, as shown in FIG. 3, an intervening adhesive comprising a thermosetting resin is used to bond a surrounding rectangular strip of lead-fixing tape 10c to the tip sections of the inner leads 1 which comprise inner-lead-connecting sections 7 coated with the plating layers 8.

Then, part of the inner leads 1 which includes the inner-lead-connecting sections 7 and part of the lead-fixing tape 10c are concurrently cut off by stamping, with a cutting die along cutting lines C, indicated in the drawing as two-dot chain lines, to form a lead frame as illustrated in FIG. 1(a) and FIG. 1(b).

In this connection, lead frames with an insulating tape connecting tip portions of inner leads are publicly known. For example, Japanese Laid-Open Patent No. Sho 64-27236 discloses a lead frame with an insulating tape adhered to the portions of inner leads which are located inward from their sections for wire bonding and location of the tip section of the insulating tape between the island and the inner leads. Japanese Laid-Open Patent No. Hei 3-124055 discloses a lead frame with an insulating tape adhered to the underside of the tip sections of inner leads. The insulating tape has a thermosetting adhesive to a thickness as great as a third or more of the thickness of each of the inner leads, and is adhered to ensure the spacings between the leads with the thermosetting adhesive.

According to the above-described prior art shown in FIG. 1(a) and FIG. 1(b), the lead-connecting tape 10c and the adhesive are also stamped at the same time when the inner-lead-connecting sections 7 are cut off. Since the lead frame, the lead-fixing tape 10c, and the adhesive are made from different materials, however, they are difficult to cut successfully. Particularly the tape 10c tends to peel due to its friction with the die returning after cutting, in cases where the tape 10c is bonded to the right side of the lead frame (the side on which a semiconductor chip is mounted). When the lead-fixing tape 10c peels, effects resulting from bonding the tape 10c to the inner leads 1 are impaired, thus resulting not only in inconveniences such as deformation of the inner leads 1 or shorts in the bonding wires, but also in obstructed movement of the bonding tool due to peeling of the tape 10c.

In order to overcome this problem, it may be proposed to bond the lead-fixing tape 10c after the inner-lead-connecting sections 7 are cut off and removed. In this case, however, vibrations which occur during transport and handling of the trimmed lead frame may cause deformation of the inner leads 1, and may result in inconveniences such as difficulty in bonding the lead-fixing tape 10c and shorts in the bonding wires. According to the prior art described above, since the lead-fixing tape 10c is bonded with an adhesive such as a thermosetting resin which is rendered rigid when set, cracking occurs in the adhesive due to vibrations occurring during transport, etc, and this also causes the lead-fixing tape 10c to peel.

Configurations as disclosed in the Japanese Laid-Open Patent No. Sho 64-27236 where the fixing tape extends off the tips of the inner leads produce a problem in that the resin resists flowing into the gaps between the tips of the inner leads and the island. Although a reliable solution to the problem is to apply fixing tape along the tips of the inner leads, appliers available at present for applying fixing tape have a maximum application precision only on the order of ±0.1 mm, and therefore their use for applying the tape along the tips results in the production of a lot of defective lead frames with the tape extending off the tips of the inner leads to impede flowing of the resin, as mentioned above.

A first embodiment of the present invention will now be explained with reference to the drawings.

Figure 4A:
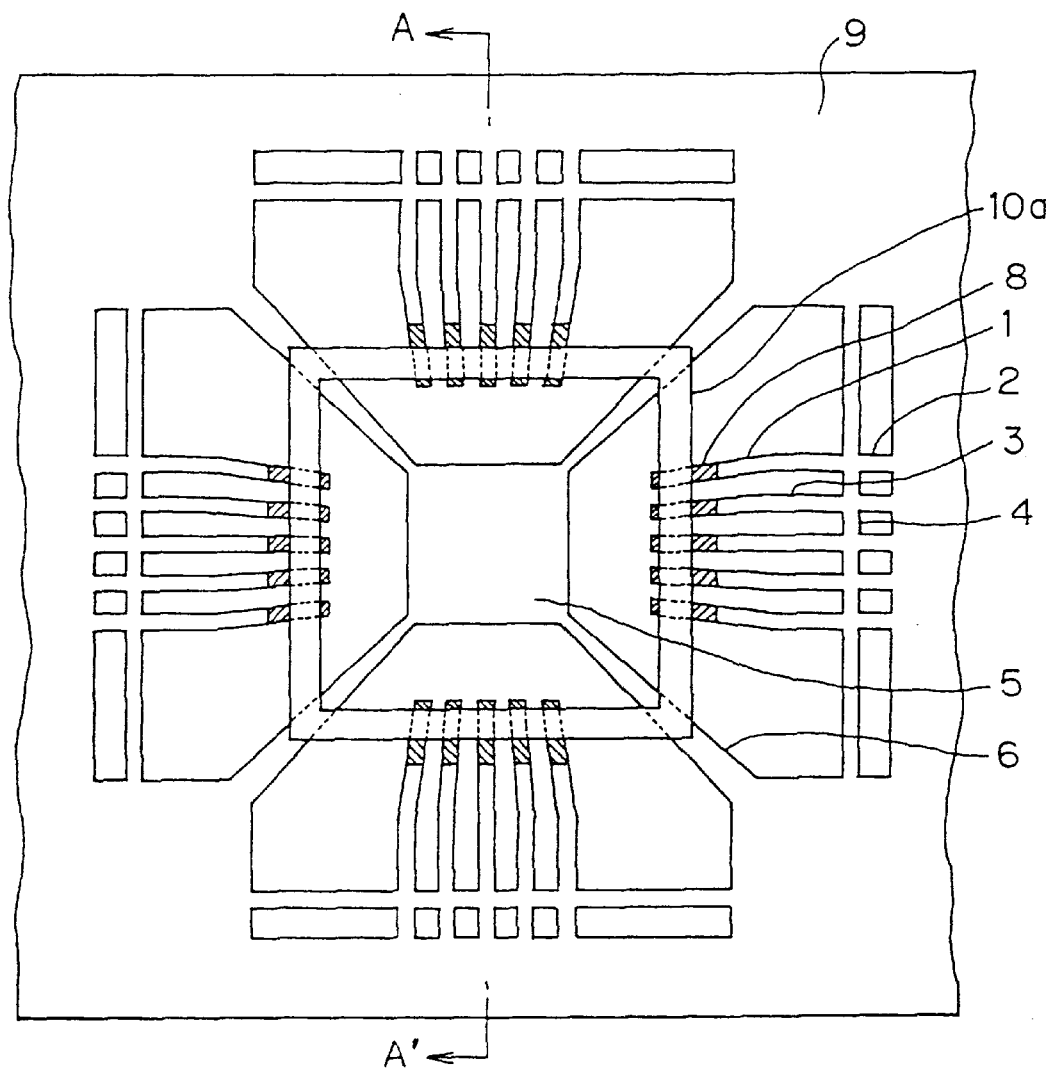
FIG. 4(a) is a plan view of a lead frame according to a first embodiment of the present invention.
Figure 4B:
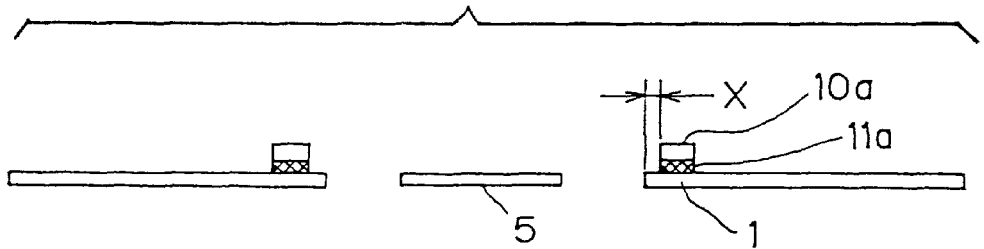
FIG. 4(b) is a cross-sectional view taken on the line A–A' in FIG. 4(a)

Turning to FIG. 4(a) and FIG. 4(b), a lead frame 9 formed of "alloy 42", a Cu material or the like comprises an island 5 supported by island supports 6 at its four corners and leads 3 extending from the frame section to the island 5. The leads 3 comprise inner leads 1 which are subjected to wire bonding and outer leads 2 which will lead out of the package, the inner leads 1 and the outer leads 2 being connected to each other with dam-bars 4 which serve to prevent leakage of the resin which has been used for molding. The surface of the tip section of each of the inner leads 1 has a plating layer 8 formed thereon, and lead-fixing tape 10a is bonded to the distal sections of the inner leads 1 with an adhesive 11a having an average thickness of approximately 20 μm.

In this state, the inner side of the lead-fixing tape 10a is bonded at a position 0.3 mm outward from the tips of the inner leads 1. Since now-available tape appliers are able to apply lead-fixing tape with a maximum precision on the order of 0.1 mm, the distance X between the inner side of the lead-fixing tape 10a and the tips of the inner leads 1 must be set to 0.1 mm or greater. In cases where the inner side of the lead-fixing tape 10a is located at a position more than 2 mm outward from the tips of the inner leads 1, the application of the lead-fixing tape 10a becomes useless because the non-fixed portions of the tips of the inner leads 1 in which the bonding wires may sweep when subjected to molding have lengths greater than 2 mm. Accordingly, it is recommended that the lead-fixing tape 10a is bonded to the inner leads 1 in such a manner that the distance X between the tips of the inner leads 1 and the inner side of the lead-fixing tape 10a is set to 0.1 mm–2 mm.

The lead-fixing tape 10a is formed as a tape of a thermosetting resin such as polyimide, a tape of a thermoplastic resin such as polypropylene or a tape of a composite resin material which is a dispersion of a rubber material such as acrylonitrile, butadiene or styrene in a thermoplastic resin. In addition, the adhesive 11a available for use includes a composite material which is prepared by dispersing a rubber material such as a nitrile, butadiene or rubber in a thermosetting resin comprising a phenol resin or the like, and an adhesive which comprises an acrylic, thermoplastic resin material and acquires elastic properties when set.

An explanation will now be given regarding a method of manufacturing a lead frame according to the first embodiment of the present invention shown in FIG. 4(a) and FIG. 4(b), with reference to FIG. 5 through FIG. 7.

Figure 5:
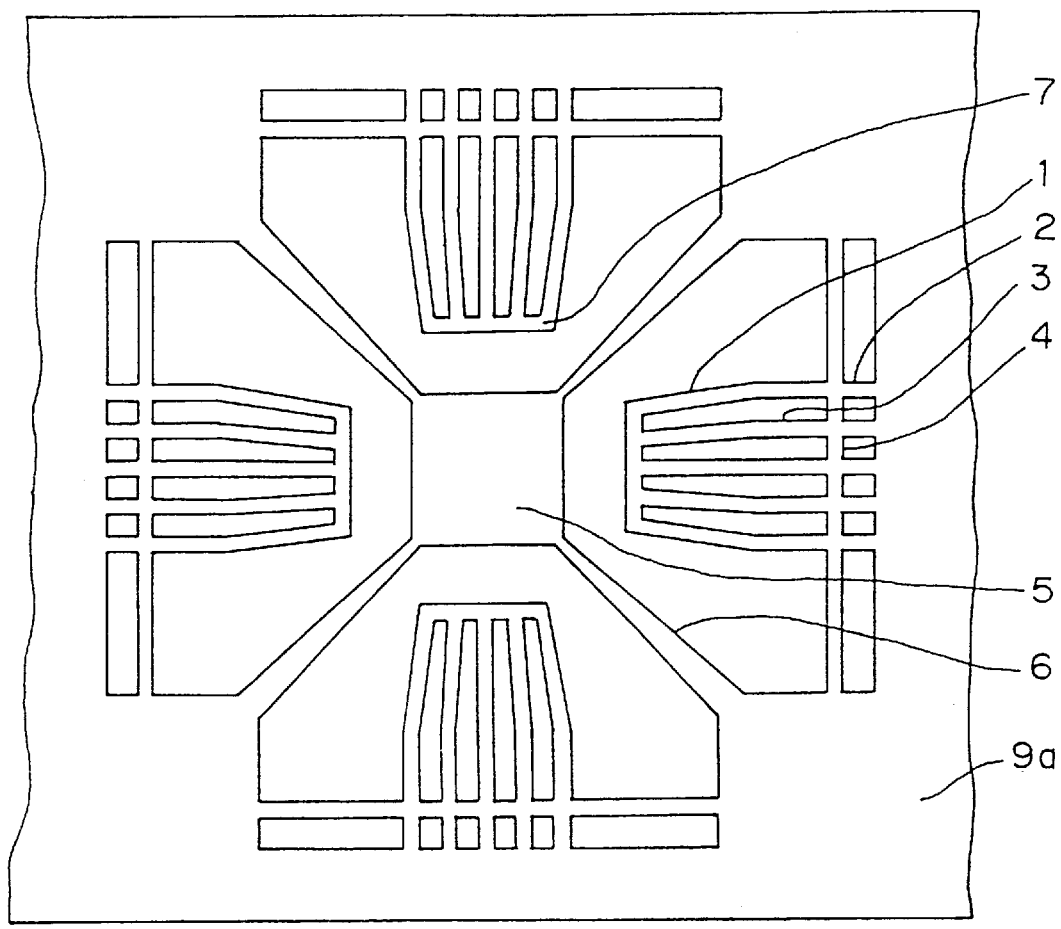
FIG. 5 is a plan view illustrative of a method of manufacturing the lead frame according to a first embodiment of the present invention.

First, as shown in FIG. 5, a lead frame base 9a is equipped with leads 3 which are connected with dam-bars 4 and have inner leads 1 and outer leads 2, and an island 5 supported by island supports 6, and is formed by etching or pressing a lead frame base material composed of "alloy 42", a Cu material or the like. Here, the tip sections of each of the inner leads 1 on each side are connected with an inner-lead-connecting section 7.

Figure 6:
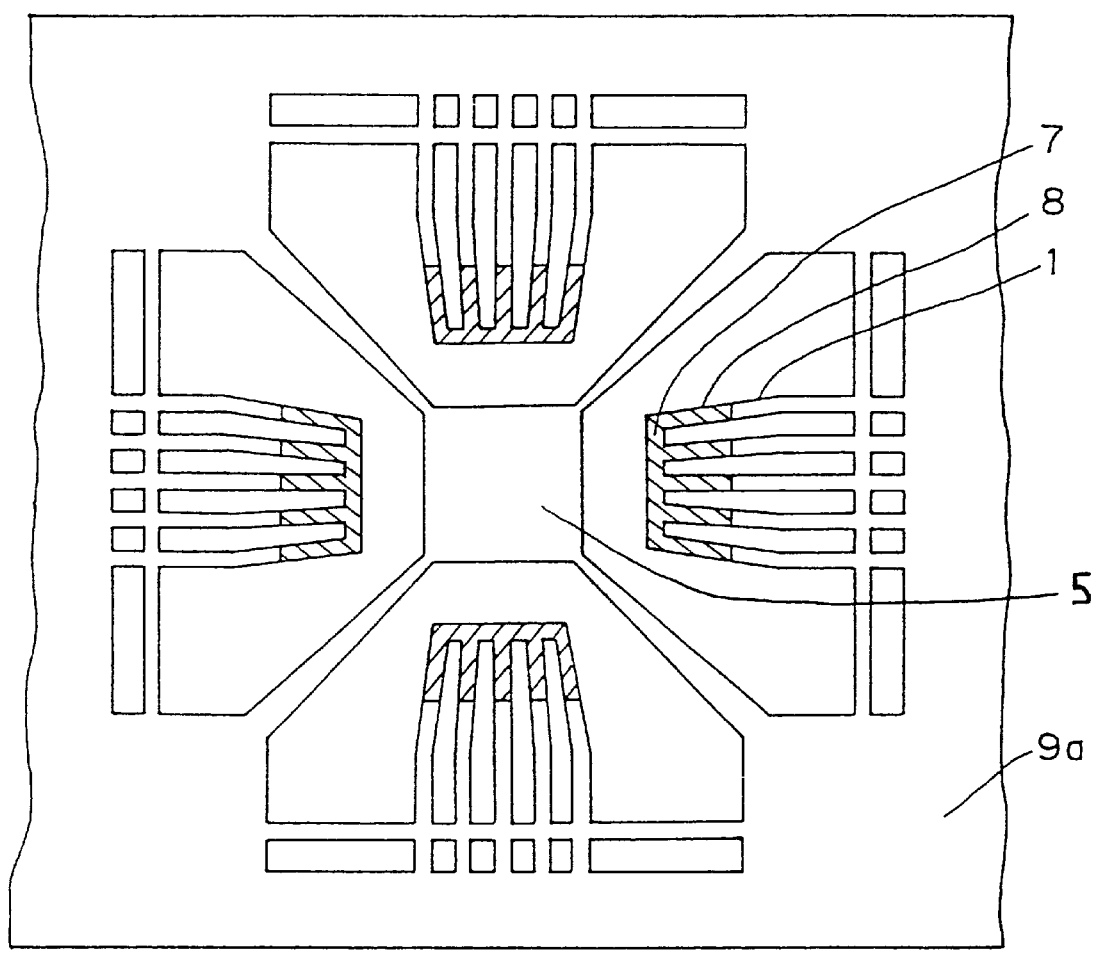
FIG. 6 is another plan view illustrative of the method of manufacturing the lead frame according to a first embodiment of the present invention.
Figure 7:
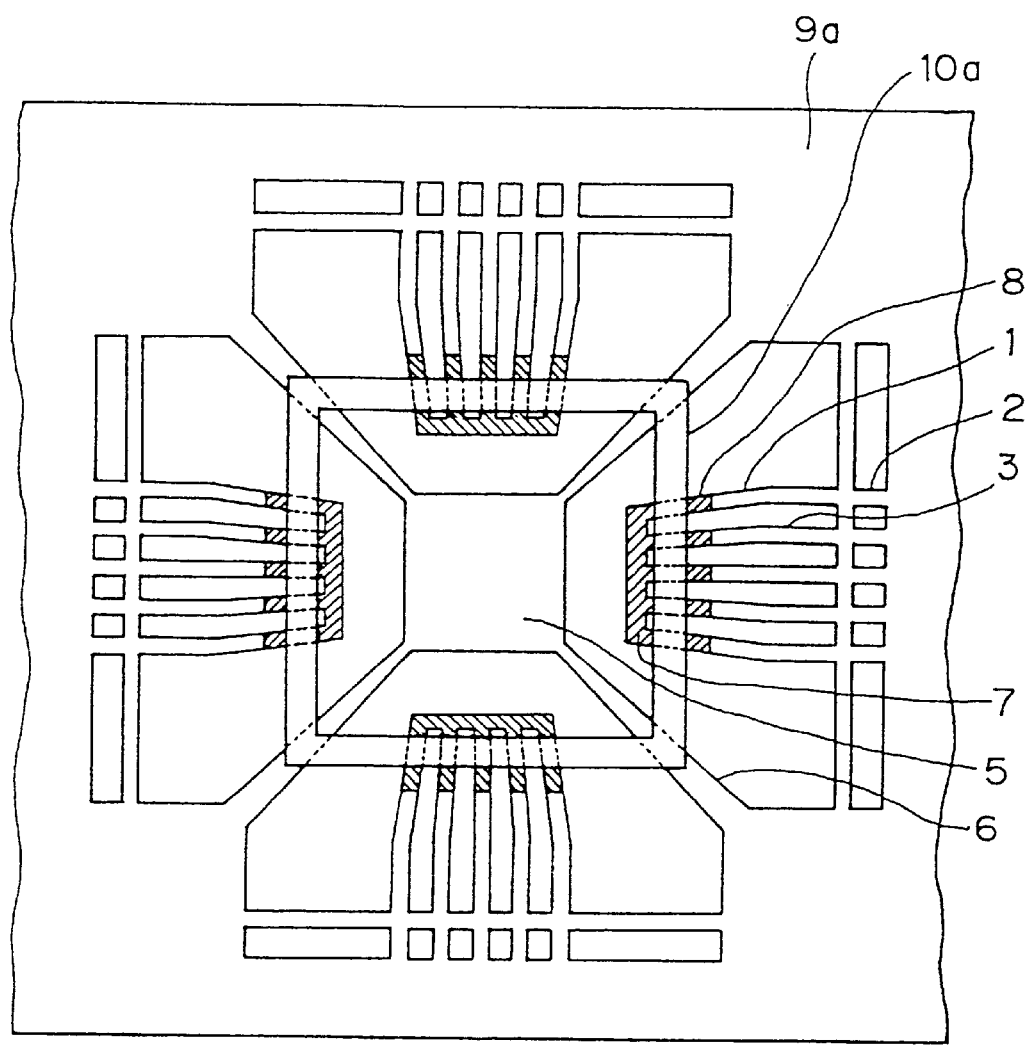
FIG. 7 is an additional plan view illustrative of the method of manufacturing the lead frame according to a first embodiment of the present invention.

Then, as shown in FIG. 6, in order to increase reliability of wire bonding between the inner leads and pads on a semiconductor chip, desired sites of the inner leads 1 which are located in the vicinity of the island 5 are coated with plating layers 8. Here, the plating is usually Ag plating deposited to a maximum thickness of 15 μm.

Thereafter, a lead-fixing tape starting material previously provided with an adhesive capable of acquiring elastic properties when set, is cut out into a desired form with a die or the like to form the lead-fixing tape 10a. This tape 10a is then bonded to the inner leads 1 of the lead frame base 9a with a tape applier, as shown in FIG. 7. The inner leads 1 are then cut at their tip sections with a pressing machine to provide a lead frame according to the present embodiment which is shown is FIG. 4(a) and FIG. 4(b).

Regarding the plated regions to be provided on the inner leads 1, since bonding wires are bonded so as to straddle over the lead-fixing tape 10a, the plating is preferably performed at least across the areas to which the lead-fixing tape 10a has been applied, toward the dam-bars 4. Also, concerning the side on which the lead-fixing tape 10a is to be applied, the tape 10a is preferably applied at the side on which a semiconductor device is mounted on the island 5 so as not to obstruct transport of semiconductor devices to be incorporated in assembly facilities, etc. Since the lead-fixing tape starting material provided with an adhesive is stamped into a desired form with a die or the like, the width of the lead-fixing tape 10a is preferably designed to be greater than the thickness of the lead-fixing tape starting material at the minimum.

With the lead frame formed in this way, when the inner-lead-connecting sections 7 are cut off, the cutting die cannot contact and cause peeling of the lead-fixing tape 10a since the lead-fixing tape 10a is located outward from the positions at which the inner leads are cut. In addition, since the adhesive which is used to bond the lead-fixing tape 10a is composed of a material which is rendered elastic when set, the adhesive itself is capable of absorbing external forces due to vibrations which may be exerted on the lead frame during transport, and therefore cracking in the adhesive may be prevented.

Figure 8:
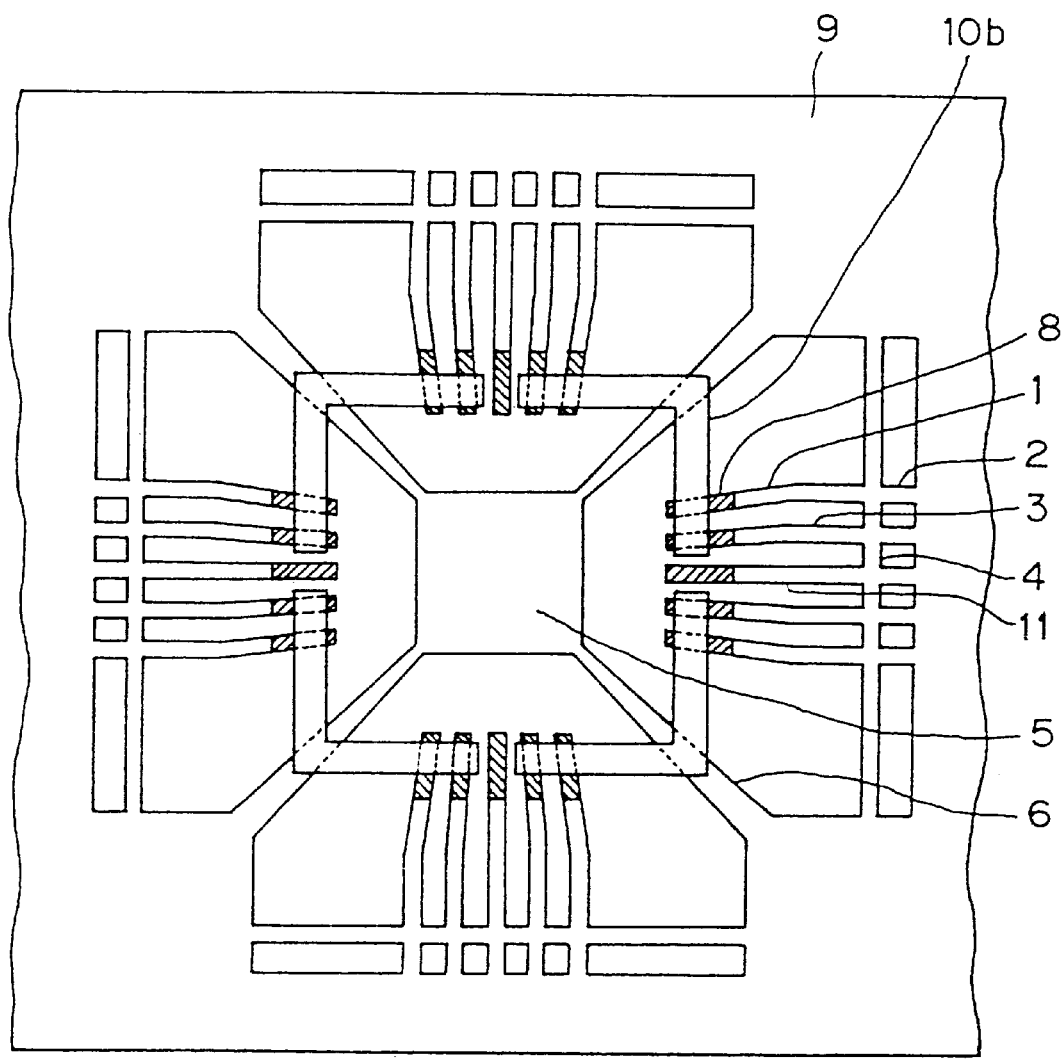
FIG. 8 is a plan view illustrative of a lead frame according to a second embodiment of the present invention.

A second embodiment of the present invention will be explained with referring to FIG. 8. In the same drawing, portions corresponding to those of the first embodiment are referred to by like reference numerals, and thus an explanation thereof is omitted. According to the present embodiment, lead-fixing tape 10b is bonded only to the inner leads 1 located near the island supports 6 at the corners and is not bonded to inner leads 11 located in the centers of the sides. Generally, corners at which inner leads and bonding wires have greater lengths are more susceptible to deformation and shorts than the centers of the sides. For this reason, only the inner leads 1 at the corners are fixed with the lead-fixing tape 10b according to the present embodiment. The present embodiment has the effect of lowering the cost of lead-fixing tape because the lead-fixing tape is applied to the inner leads only at indicated places.

Although the foregoing explanation was focused on the preferred embodiments, the present invention is not limited to those embodiments, and a variety of modifications may be made within the scope of the appended claims. For example, although the lead frames according to the embodiments explained above have dam-bars, the present invention may be applied even to lead frames without dam-bars, and also to lead frames with dam-bars formed of a resin or the like which is different from the lead frame base material.

What is claimed is:

1. A method of fabricating a lead frame, comprising:

providing a lead frame having an island and a plurality of inner leads each extending radially from a vicinity of said island and joining together at respective tip portions by an inner-lead-connecting element, each of said inner leads being provided with a first position at which a cutting operation is to be performed to remove said inner-lead-connecting element together with the respective tip portions of said inner leads, and each of said inner leads being further provided with a second position at which a bonding wire is to be connected;

adhering tape to said inner leads at a position between said first and second positions such that a distance between said tape and said first position of each of said inner leads is longer than a deviation occurring in adhering said tape; and performing a cutting operation on each of said inner leads at said first position to thereby remove said inner-lead-connecting element together with the respective tip portions of said inner leads.

2. The method as claimed in claim 1, further comprising plating said inner leads from said second position inward to at least said first position prior to adhering said tape.

* * * * *